(12) United States Patent
Braund

(10) Patent No.: US 6,373,942 B1
(45) Date of Patent: Apr. 16, 2002

(54) HANDS-FREE COMMUNICATION DEVICE

(75) Inventor: Paul Mather Braund, Sausalito, CA (US)

(73) Assignee: Paul M. Braund, San Francisco, CA (US)

( * ) Notice: Subject to any disclaimer, the term of this patent is extended or adjusted under 35 U.S.C. 154(b) by 0 days.

(21) Appl. No.: 09/544,893

(22) Filed: Apr. 7, 2000

(51) Int. Cl.[7] ............................................... H04M 1/00
(52) U.S. Cl. ...................................................... 379/430
(58) Field of Search ............................. 379/430, 420; 381/327, 328, 329, 330

(56) References Cited

U.S. PATENT DOCUMENTS

| | | | |
|---|---|---|---|
| 5,191,602 A | 3/1993 | Regen et al. .................. 379/58 |
| 5,210,792 A | 5/1993 | Kajihara ....................... 379/430 |
| 5,369,857 A | 12/1994 | Sacherman et al. ........... 29/594 |
| 5,757,944 A | 5/1998 | Jensen et al. ................ 381/187 |
| 5,812,659 A | 9/1998 | Mauney et al. ............. 379/430 |
| 6,058,198 A | * 5/2000 | Aceti et al. .................. 381/323 |

* cited by examiner

Primary Examiner—Jack Chiang
(74) Attorney, Agent, or Firm—Jones, Day, Reavis & Pogue

(57) ABSTRACT

An ultra light, easily manufactured, flexible hands-free communication device which fits over one ear for monaural sound or over both ears for biaural or stereo sound. The communication device may receive and/or transmit sound by an electrical wire input or an antenna.

56 Claims, 10 Drawing Sheets

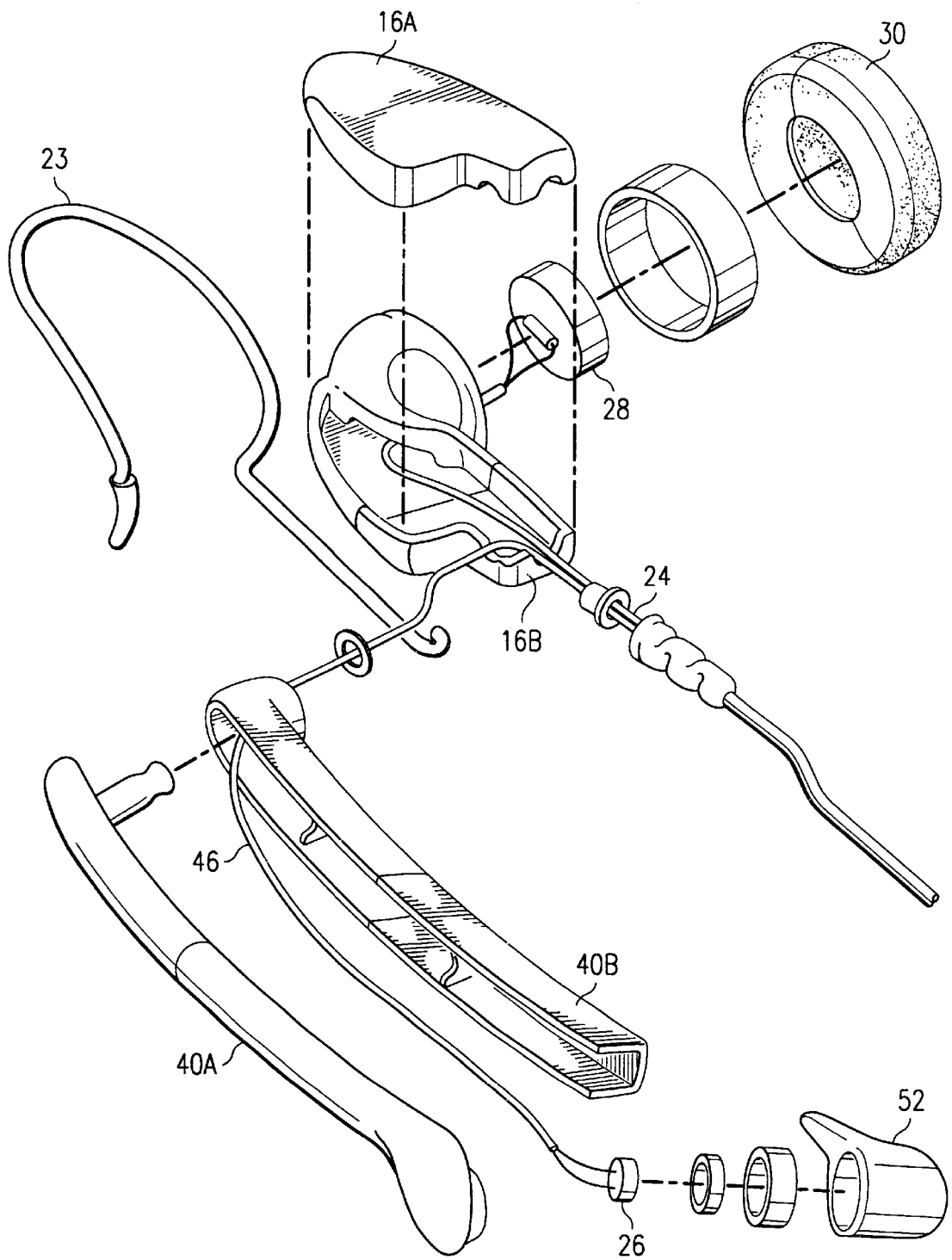

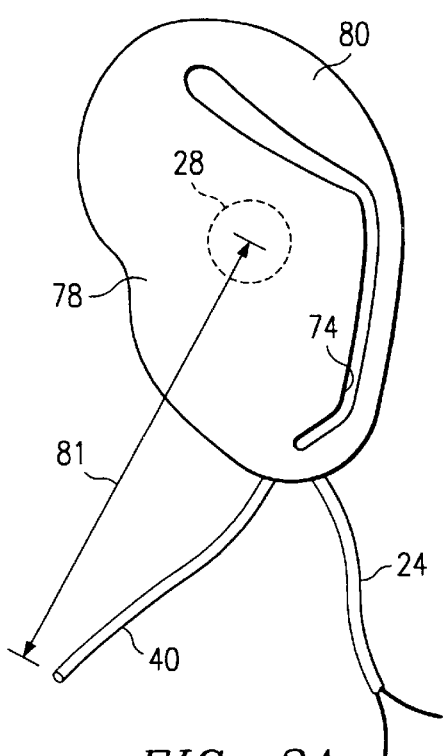
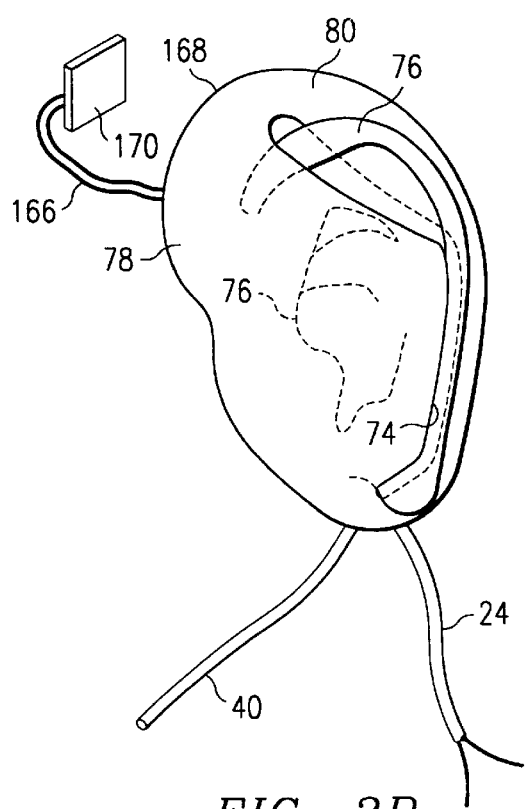
FIG. 3A
FIG. 3B
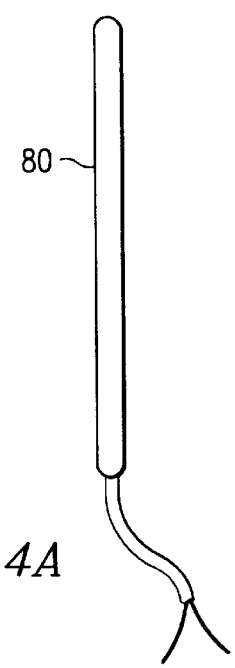
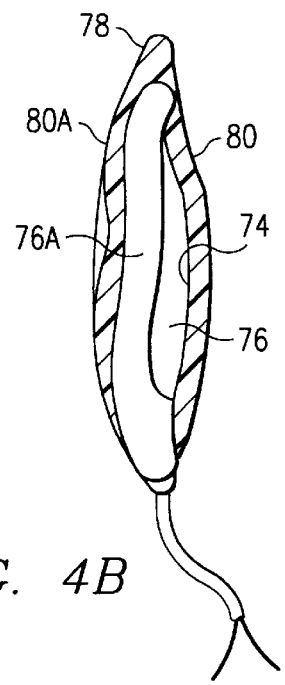
FIG. 4A
FIG. 4B

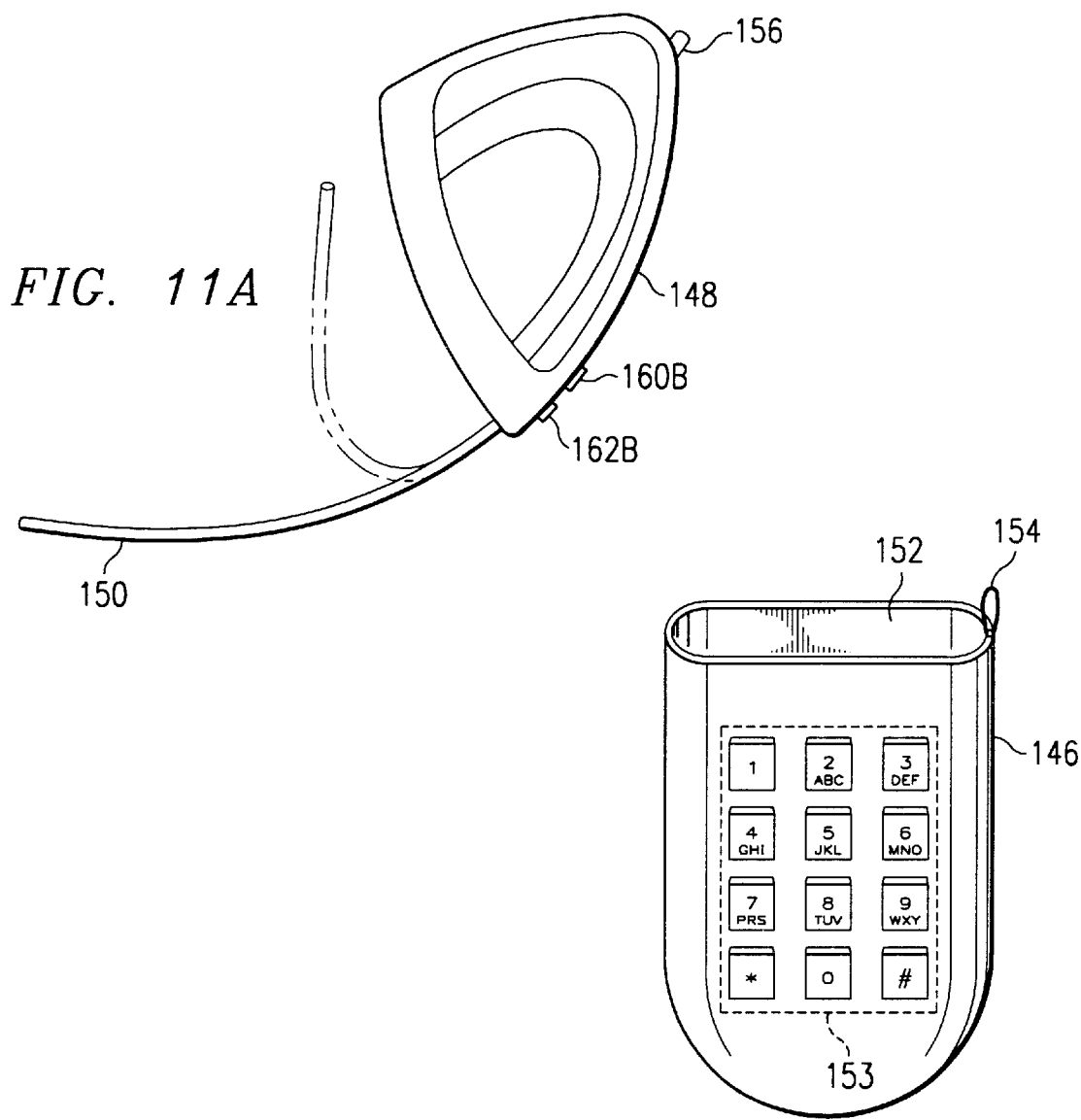

HANDS-FREE COMMUNICATION DEVICE

BACKGROUND OF THE INVENTION

1. Field of the Invention

The present invention relates to hands-free communication devices and more specifically to a flexible lightweight and comfortable communication device which is suitable for fitting over one or both ears and is manufactured with a minimal number of components. The communication device may operate as a sound receiver only and provide an audible output. Alternatively, the device may also include a microphone and operate both as a receiver and transmitter of sound.

Consequently, the device is suitable for uses with a telephone network, a computer having voice synthesis and/or voice recognition capabilities as well as other systems which receive and/or generate an audible output.

In addition, two of the devices of this invention, one for each ear, may be provided so as to receive biaural or stereo sound.

The invention also relates to a new manufacturing paradigm or approach that substantially reduces the time consuming and labor intensive assembly of a large number of components.

2. Description of Related Art Including Information Disclosed Under 37 CFR 1.97 AND 1.98

There has been a need for hands-free communication devices at least as early as the early telephone. For example, early telephone operators were required to make connections between one or more callers by manually connecting jumper cables between the appropriate circuits. These early operators wore heavy headsets which included a headband to support at least one earpiece next to the operator's ear. The equipment itself, along with the necessary wiring, was so heavy that the earliest telephone operators also wore a separate microphone supported in front of the operator's mouth by its own neckband.

Eventually, the earpieces and the microphone as well as the wiring were reduced in size and weight so that the microphone could be maintained in front of the user's mouth by a cantilever boom extending from the headband or the earpiece to a location in front of the operator's mouth. Efforts have continued to further reduce size and weight such that today the headband can be eliminated such that the conductors, the earpiece, the cantilever boom and mouthpiece may simply be supported by hanging over the ear. In addition, because of miniaturization of components for some uses, signals can be provided by radio waves so that the connecting wiring can be eliminated altogether and replaced by a small lightweight antenna. An example of a prior art device includes U.S. Pat. No. 5,191,602 issued to Paul L. Regen and Marv Tseu on Mar. 2, 1993. This patent discloses a telephone headset apparatus for use with an existing cellular telephone. The headset is connected to the handset portion of the telephone system. A feature of the headset apparatus ensures that normal handset operation of the telephone system does not effect the use of the headset itself. In addition, the handset may remain resting in a cradle even while the headset is in operation.

Another device is described in U.S. Pat. No. 5,210,792 issued on May 11, 1993 to Kazuhiko Kajihara and discloses an ear-hang type headset which includes a microphone attached to the forward end of a microphone arm or boom, and a base portion which is connected at the other end of the microphone arm or boom. An ear hanger formed in a shape conformable to the outer periphery of the ear and an earphone formed in a shape receivable in the ear and having a receiving unit are connected to the microphone arm base. The ear hanger and the earphone are made to be rotatable with respect to the microphone arm base so that the earphone and the ear hanger can be located at the entrance of the ear and the outer periphery of the ear respectively.

U.S. Pat. No. 5,575,944, issued May 26, 1998, to Finn Jensen and Steve McGugan discloses a telephone headset which includes a body having a microphone at one end and a transducer at the opposite end. An ear hook is used to attach the apparatus to the ear of the operator. The mechanism is located and balanced such that the headset apparatus remains properly balanced and within the sound envelope of an operator for uninterrupted operation.

U.S. Pat. No. 5,812,659, issued Sep. 22, 1998, to Daniel W. Mauney, et al. discloses an ear-mounted microphone device configured for being supported in the ear. The microphone device includes a microphone element contained within a housing which is configured at one end to be mounted at a user's ear canal. When the housing is so mounted, the microphone element is positioned closely adjacent to the user's head such that the housing and the user's head cooperatively alter the sensitivity of the microphone. This arrangement provides an enhanced directional orientation and sensitivity of the microphone element towards the user's mouth to a greater degree than is provided when the housing and microphone element are not mounted at the ear canal. A speaker element may be included within the ear device and can be decoupled mechanically so as to avoid feedback. The system can operate with full duplex and thereby enable hands-free communication and direct voice commands by the user through computer modems, telephone networks and other communication systems.

With the exception of the U.S. Pat. No. 5,812,659 patent, a review of the above referenced patents clearly indicates that although hands-free headsets have been made smaller and now weigh significantly less, the same basic apparatus and design approach is still being used. That is, a device made of a significant number of parts and has an earpiece which is either supported by a headband or is balanced and supported by the upper ear. In addition, a sound pick-up boom extending to a point adjacent the user's mouth may be connected to the earpiece. The pick-up boom may support a miniature microphone at the end of the boom with wires traveling to structure proximate the ear. Alternately, the boom may simply be a hollow tube providing an enclosed air path from the mouth area of a user to a microphone included in the structure proximate the ear. Although the device of the '659 patent does describe embodiments which have substantially eliminated the voice pick-up boom, the device is still manufactured with a large number of components. The patent also discloses a more recent approach of supporting the communication device either in the inner ear canal or by ear tissue surrounding and approximate the ear canal.

Therefore, it is an object of the present invention to provide a lightweight comfortable sound receiving device.

It is a further object of the invention to provide a lightweight, comfortable communication device which both receives and transmits sound.

It is another object of the invention to provide an easily manufactured and simplified communication device.

It is still another object of the invention to provide a communication device suitable for use as human-to-machine interface between the wearer of the device and any one of a selection of systems such as, but not limited to, telephone systems, cellular telephone systems, computer systems and music systems.

It is yet another object of the present invention to provide a simplified and improved method for fabricating communication devices.

SUMMARY OF THE INVENTION

The above-mentioned objects and other objects are achieved by the present invention which comprises methods and apparatus for providing an ultra light and substantially flat hands-free communication device, including but not limited to earphones or a headset. The apparatus includes a planar or flat flexible support member, and a flexible printed circuit bonded to or integral with the planar flexible support member. The flat flexible support member preferably has "memory" so that if it is distorted so as to fit over an ear it will spring back or return to its original shape. There is also included an input connection for receiving signals having a sound or audible content which is connected to the flexible printed circuit. The input connection could be a wire suitable for connecting to telephone circuitry or to a computer, such as, for example, a connection to a USB (Universal Serial Buss). Alternately, the system may be wireless such that the input connection is to an antenna. The device is also clearly compatible for use with the new short range connection technology and protocols referenced to as "Blue Tooth". It will be appreciated that other technology and protocols for wireless systems are equally applicable as the "Blue Tooth" technology.

The flexible printed circuit may, for a simple headset and microphone embodiment, "process" the received signals by simply providing printed conductor paths and connections for the headset and microphone signals. Alternately, if the communication device of this system is a much more complex integral telephone or a human/machine interface embodiment with voice recognition and voice synthesis the printed circuit may include a microprocessor which processes the received signals having the sound content according to an elaborate algorithm and generates output electrical signals representative of the processed sound content. Thus, when used to describe the present invention, the phrase "signal processing" is intended to cover a range of operations from the simple routing of electrical signals from one connection point to another connection point to elaborate signal recovery, decoding and demultiplexing processes.

A sound generation device such as a speaker receives the output electrical signals which have the sound or audible content regardless of the "signal processing" and generates an audible sound representative of the sound content. It should be understood that the flexible printed circuit may be bonded to the planar flexible support member, or alternately, the planar flexible support member and the flexible printed circuit could comprise a single integral planar flexible member. It should also be understood that electronic components may be electrically connected or mounted to the printed circuit, or alternately may be manufactured as an integral part of the printed circuit.

According to a preferred embodiment, the planar flexible support member will have a selected size and a selected perimeter outline and also include a slot or separation line which follows a selected path to extend between two end points which divide the planar flexible support member into two portions. At least one of the two end points is wholly within the perimeter outline such that the two portions remain attached to each other. In a preferred embodiment, both of the two end points are within the perimeter outline so as to define a slot having a selected shape. The flexibility of the support member allows for the two portions to be further separated or spread from each other such that one of the portions may be located so as to cover at least a portion of a human ear and the other one of the two portions fits behind the ear. Consequently, it is important that the flexible printed circuit which is either bonded to or integral with the support member not prevent further spreading of the two portions at the selected cut or separation line.

The communication device of this invention is suitable for many purposes and consequently, as mentioned above, the printed circuit may simply be printed electrical conductors, or may include circuitry for processing signals which have a sound content provided from a selected group of devices or sources such as computers, telephones, radio receivers and microphones. In those instances where the communication device is used as a two-way or bidirectional communication device, there will further be included a microphone or other sound pick-up device either proximate the printed circuit or at the end of a boom. In a typical fashion, the microphone receives audible sounds and generates electrical signals representative of the received audible sounds.

According to other embodiments of the invention, the device may receive, process and display signals with a visual content, and may also incorporate various flexible or semi-flexible electronic components including but not limited to key pads, solar or photoelectric cells, batteries, microdisplays, etc.

BRIEF DESCRIPTION OF THE DRAWINGS

These and other features of the present invention will be more fully disclosed when taken in conjunction with the following Detailed Description of the Invention in which like numerals represent like elements and in which:

FIG. 3A is a side view of the assembled device of FIG. 2;

FIG. 3B is a side view of the assembled device of FIG. 2 fitted onto a human ear;

FIG. 4A is an edge view of the assembled device of FIG. 2;

FIG. 4B is an edge view of the assembled device of FIG. 2 fitted onto either a left or a right human ear;

FIG. 11A shows an embodiment of the device according to the teaching of this invention having an alternate selected perimeter outline;

FIG. 11B shows a case for receiving the headset of FIG. 8A which includes a "touch" telephone type keypad;

FIG. 11C shows the reverse side of the case of FIG. 8B which includes a group of solar or photoelectric cells for providing power to the headset of FIG. 8A;

DETAILED DESCRIPTION OF THE INVENTION

Figure 1A:
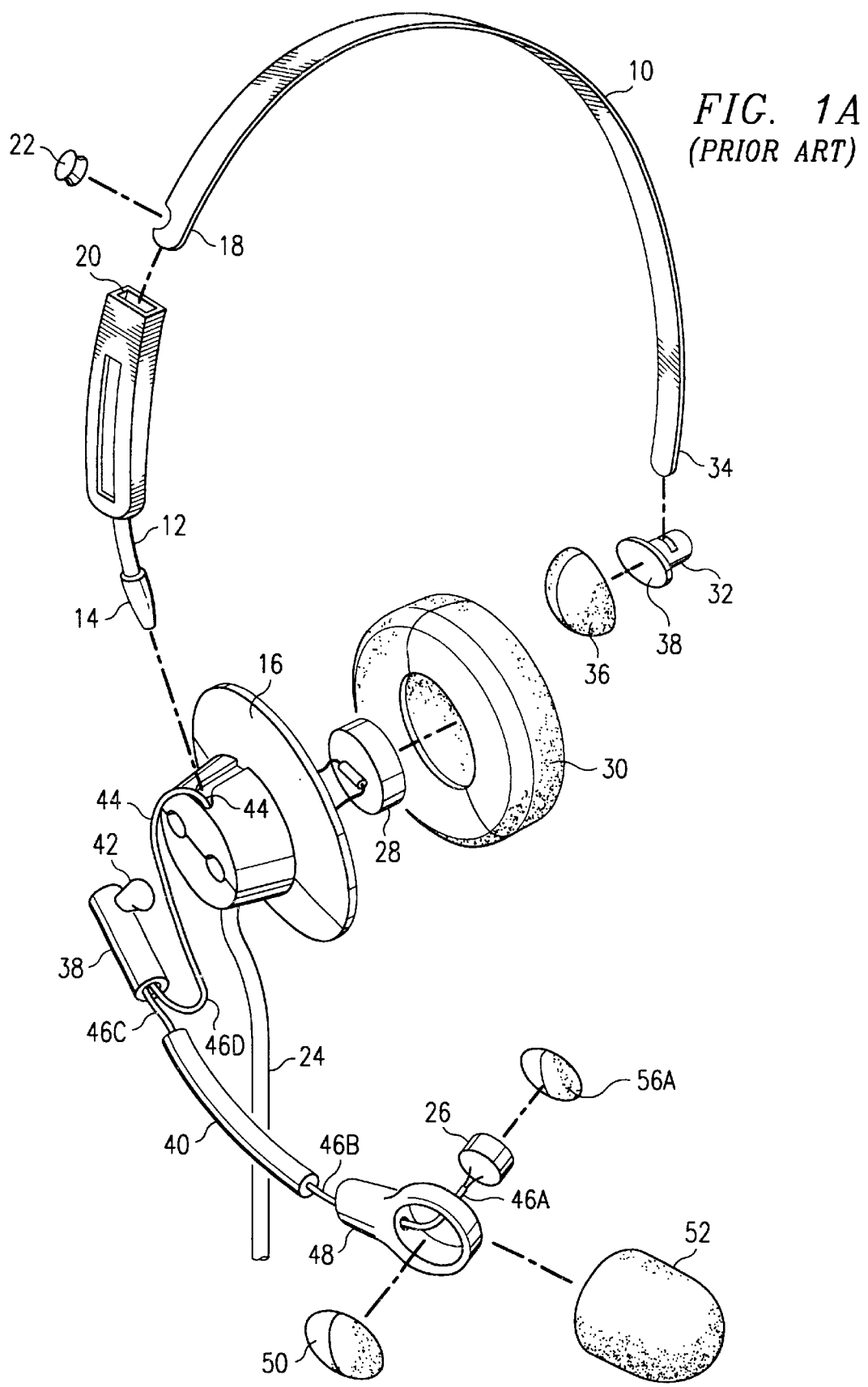
FIGS. 1A and B are exploded views of prior art headsets with microphones.

An exploded view of a typical prior art headset having a microphone on a boom is shown in FIGS. 1A and 1B. As shown, the prior art device of FIG. 1A includes a two-piece resilient headband 10 and 12 rotatably mounted by bayonet portion 14 to a speaker or earphone housing 16. According to the embodiment of FIG. 1A, the two-piece headband is adjustable by end portion 18 of section 10 selectively moving within slot 20 of section 12. A friction member 22 fits in a cutout on end 18 of portion 10 so that the portion 10 will maintain a selected relationship with portion 12. Prior art FIG. 1B, on the other hand, does not include a headband, but instead uses an ear hook 23. The earphone or speaker housing 16 typically receives input electrical signals from cable 24. Cable 24 also carries output electrical signals from microphone 26 to be discussed later. The input electrical signals carry an audible content such as voice or other audible sounds to a speaker device 28. A foam rubber covering or other soft covering 30 is used to make the fit of the speaker or headphone comfortable against the user's ear. An end terminal piece 32 is secured to end 34 of flexible headband portion 10. A second smaller foam rubber member 36 fits over the large portion 38 of the terminal piece 32 also for the purpose of making wearing the resilient headband and headphone more comfortable for the user. Thus, it is seen that foam rubber portions 30 and 36 of the prior art device bear against an ear on one side of a user's head and the temple area on the opposite side. The headset of this prior art device also includes a two-piece microphone boom for supporting the microphone 26. The two-piece microphone boom includes a sleeve portion 38 which receives an elongated tube portion 40 which travels from the earphone housing 16 to a location in front of the user's mouth. In the embodiment shown, the sleeve portion 38 also includes a pivot knob 42 so as to allow almost unlimited vertical rotation of the microphone boom and limited horizontal movement. FIG. 1B, on the other hand, uses a two-piece microphone boom having reference numbers 40a and 40b. As shown, microphone 26 is connected by wires 46a, 46b, 46c and 46d so as to provide electrical signals having an audio content output to connecting cable 24. Microphone 26 is maintained in the mouthpiece portion 48 of the microphone boom by means of perforated retaining members 50a and 50b. This particular prior art microphone also shows a protective foam rubber cover 52.

Thus, it is seen a typical presently available headset is comprised of a large number of components (the prior art headset of FIG. 1A includes about eighteen (18) different components) which requires the assembly of all these parts including other tedious tasks such as threading wires, making solder connections, applying glue, inspecting the finished product, packaging, etc. Consequently, typical prior art headsets which include both speakers and microphones simply are relatively expensive to manufacture. U.S. Pat. No. 5,369,857 (FIG. 1A) and U.S. Pat. No. 5,191,602 (FIG. 5) further illustrate the large number of components that must be assembled to produce presently available headsets. In a like manner, headsets which hang or are secured directly to the ear such as the headsets described in U.S. Pat. No. 5,210,792 (FIG. 3) and U.S. Pat. No. 5,812,659 (FIG. 3) typically will not use fewer components and will not be less difficult to assemble even though the headset may be somewhat lighter in weight.

The present invention on the other hand, and as will be discussed hereinafter provides for a headset or other hands-free communication device which substantially reduces the time and labor necessary for manufacturing and assembly.

Figure 2:
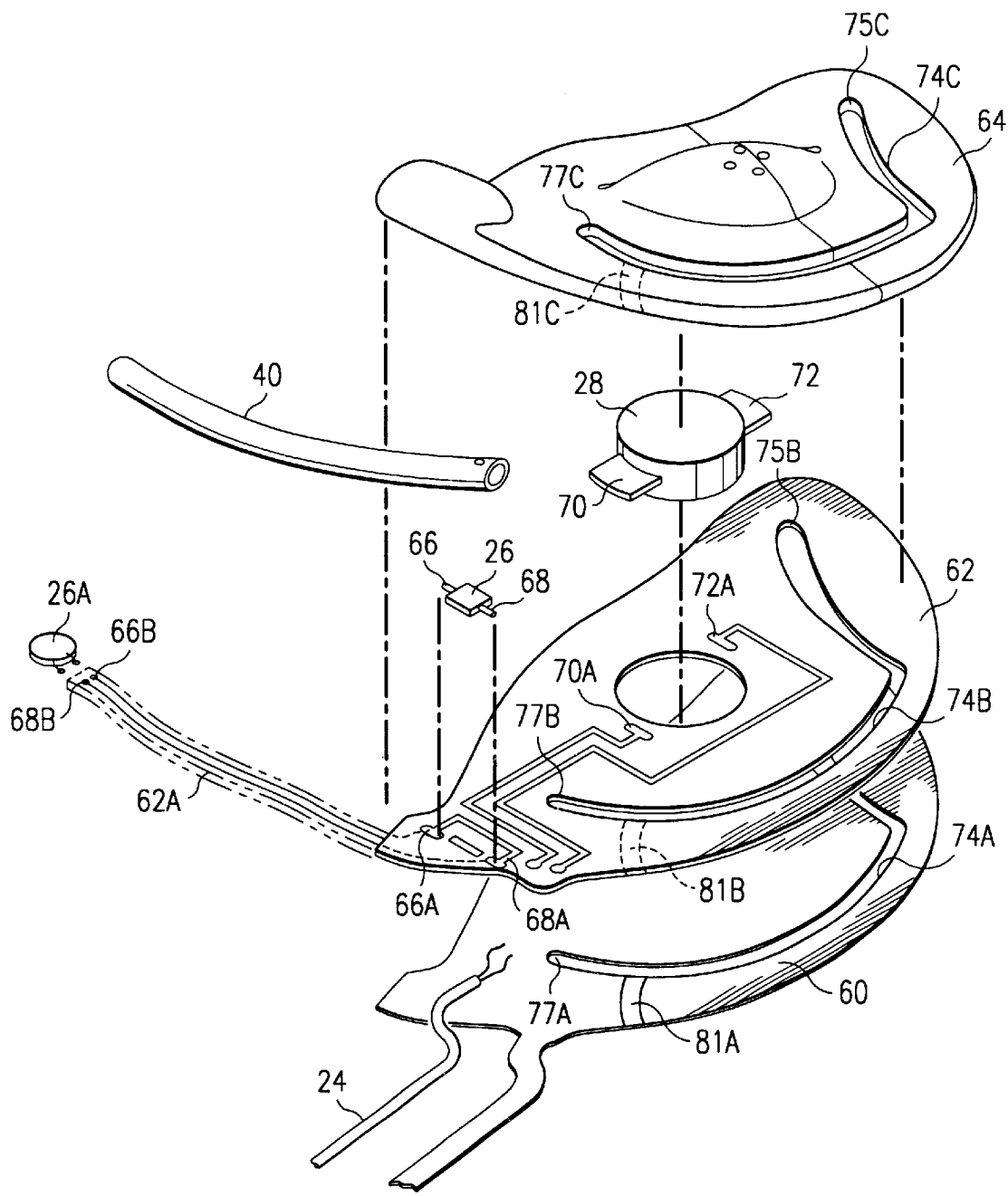
FIG. 2 is an exploded view of a headset embodiment of the hands-free communication device of the present invention.

Referring now to FIG. 2, there is shown a headset version of a hands-free communication device incorporating the teachings of the present invention. The headset device of FIG. 2 incorporates all of the functions of the headset device discussed with respect to FIGS. 1A and 1B. However, the headset device of FIG. 2 of this invention as shown, includes only seven (7) components which are easily and quickly assembled. Components of the device of FIG. 2 which serve the same function as the equivalent components of the prior art devices of FIGS. 1A and 1B, will carry the same reference numbers.

Therefore, as shown, the device of FIG. 2 includes a connection cable 24, a microphone 26, a speaker member 28 and a speaker tube or extension 40 which extends from the ear portion of the headset to a position in front of the user's mouth. Thus, it is seen that there are four (4) components which are common to the components used in the prior art. In addition, the device of this invention also includes a flexible planar or backing member 60, a flexible printed circuit board 62 and a cover or protective member 64. Thus, it is seen that whereas the prior art headset with a microphone included about twenty (20) different elements requiring much tedious assembly, the hands-free headset of the present invention includes only seven (7) easily-assembled components. Furthermore, according to other embodiments of the invention, the printed circuit 62 and the flexible backing member 60 may be a single integral member. In still another embodiment, the protective cover 64 could be eliminated. Thus, a headphone and microphone manufactured according to the teachings of this invention could include as few as five (5) components. For a design using the reduced number of components, it may be desirable to provide the completed device with a protective coating, providing RF shielding or electrical insulation.

More specifically with respect to the device of FIG. 2, the flexible planar support member 60 may be made of a variety of resilient material such as a high-quality foam rubber, polypropylene, polycarbonate, or other plastic for best performance and comfort. Alternately, a heavy paper may be used for inexpensive and throw-away headsets. A flexible printed circuit board 62 sometimes referred to as the assembly spline is bonded to support member 60. The embodiment shown in FIG. 2 may be formed of heat retardant sheet plastic (such as, for example, 0.35 mm polycarbonate) printed with the appropriate circuitry. The printed circuit of FIG. 2 is simply comprised of electrical conductors for transmitting signals from one set of electrical terminals to another set of terminals. However, as mentioned above and as will be discussed in detail hereinafter, printed circuit 62 could be an elaborate array of electronic components such as microprocessors, digital signal processors, SAW (surface acoustic wave) devices, resistors, capacitors, etc., either surface mounted to the printed circuit or integrally formed with the printed circuit. Prior to bonding the flexible circuit board 62 (shown in FIG. 2) to the flexible support member 60, the microphone member 26 will require two (2) solder operations to solder the two tabs 66 and 68 of microphone 26 to the corresponding connection pads 66*a* and 68*a* located on printed circuit board 62. Prototypes of the hands-free headset of this FIG. 2 embodiment having a total weight (not including the input cable) of about 0.02 ounces have been produced. FIG. 2 also illustrates an embodiment where printed circuit board 62 includes an extension 62*a* with a pair of conductors so as to relocate the microphone connection pads 66*b* and 68*b* to the end of extension 62*a*. Thus, in this embodiment microphone 26*a* is attached at the end of the extension 62*a* rather than on the main body of printed circuit 62.

Likewise, speaker 28 will also require two (2) solder operations so as to connect tabs 70 and 72 of speaker 28 to connection pads 70*a* and 72*a* of printed circuit board 62. Although any type of miniature speaker is suitable for use with the invention, for improved performance, a balanced electrostatic speaker is believed to be particularly suitable. Whereas, if the headset is to be an inexpensive and disposable model, very inexpensive piezoelectric speakers such as used in talking greeting cards is particularly suitable. Once the printed circuit board 62 with the attached microphone and speakers 26 and 28 respectively is bonded to the support member 60, it is then only necessary to attach speaker tube or extension 40 to cover 64 and then mount the combination protective cover 64 and speaker tube or extension 40 to the flexible circuit board 62. In one illustrated embodiment, the speaker tube 40 provides an enclosed air pathway from the user's mouth to speaker 26, and in the alternately illustrated embodiment, the tube 40 provides protection and support to the printed circuit extension 62*a*.

It should be noted, that support member 60, printed circuit board 62 and protective flexible cover 64 each have a separation cut or slot 74*a*, 74*b* and 74*c* respectively. The purpose of this slot, as will be discussed, is to allow the ultra lightweight, hands-free headset of this invention to fit over a user's ear. It is noted that although the slots 74, shown in FIG. 2, have their end points 75 and 77 wholly within the outline perimeter of the hands-free communication device, the device can still operate effectively if an end point, such as end point 77, is relocated so that it is not totally contained or within the perimeter outline as indicated at 81*a*, 81*b* and 81*c*.

Referring now to FIG. 3A and FIG. 3B, there is shown the assembled device of FIG. 2. FIG. 3A shows the device prior to being fitted onto a user's ear and FIG. 3B on the other hand, shows the headset device of FIG. 2 as it fits onto the user's ear 76. As shown in FIG. 3B, a front portion 78 of the device fits in front of the user's ear 76 whereas a back portion 80 fits behind the user's ear. Because of the integral nature of the headset of this invention, the distance between end 79 of microphone tube or boom 40 and speaker 28 is fixed as indicated by double-headed arrow 81. Consequently, calibration or adjusting circuitry may be included on printed circuit 62 to provide effective noise cancellation and elimination of feedback.

FIGS. 4A and 4B show the edge view of the device of FIG. 2 not installed and installed over ear 76 respectively. It is important to note that back portion 80 is moved to the right with respect to front portion 78 for fitting over a user's left ear and is moved to the left as indicated at 80*a* for fitting over the user's right ear. It will also be appreciated that by proper selecting of the materials and the design of the cut or separation line, the portion 80 (or 80*a*) can be moved past a threshold point where it is clicked or biased at its position and will not move back to a common plane. For example, the conforming edge of the slot or separation line may be designed such that when the two portions 78 and 80 are spaced beyond a predetermined amount, the conforming edge will interfere with each other to maintain the spread condition. Because of the very light weight of the device and the flexible material, the hands-free headset has been found to be extremely comfortable to wear for long periods of time.

Figure 5:
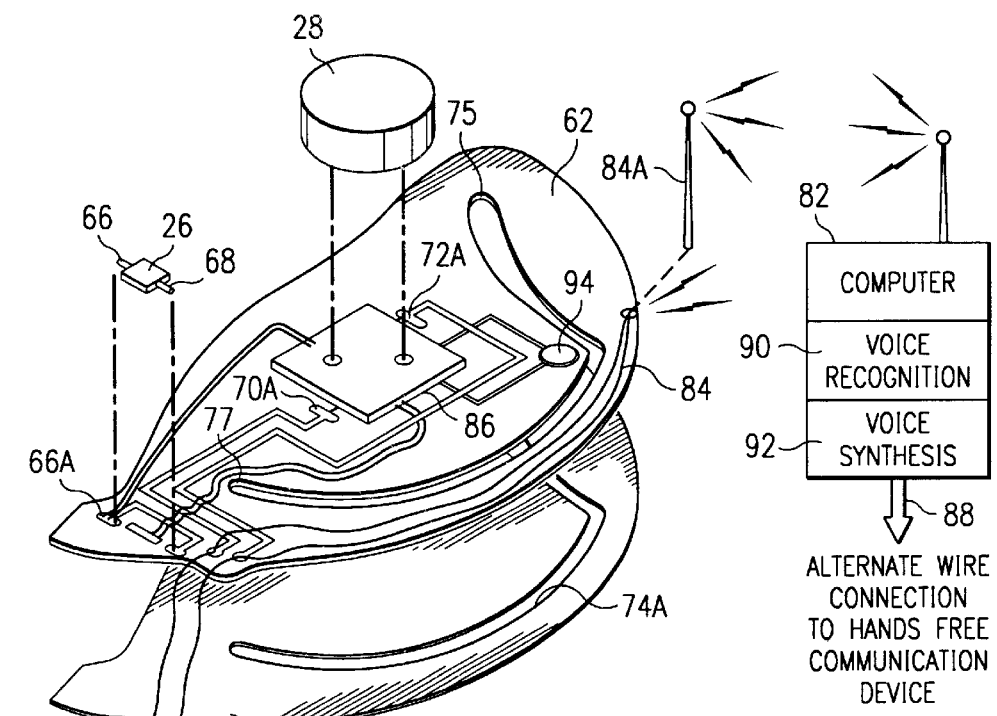
FIG. 5 shows a computer interface embodiment of the hands-free communication device of the present invention using an antenna to connect with the computer.

Referring now to FIG. 5, there is shown a computer interface embodiment of the hands-free communication device of the present invention for connecting with a computer 82. It is believed that a desktop PC type computer, a laptop, or even a handheld computer such as a palm pilot are all suitable for use. The physical outline and the appearance of the device of this invention when used for a computer interface, is substantially the same as that discussed with respect to FIG. 2. However, the device of FIG. 5 is shown as having an antenna 84 located on printed circuit 62 for communicating with the computer and therefore the printed circuit board 62 will also include radio receiver and transmit circuitry 86 for at least transmitting and receiving at short distances. As an example only, "Blue Tooth" technology, or other technologies or protocols, may be used for short distance transmitting and receiving. As shown, an external antenna portion 84*a* may be included for some embodiments to improve transmission and receiving efficiency.

The headset of the present invention particularly lends itself for use with the newly developed "Blue Tooth" technology and protocol. "Blue Tooth" is a consortium of over 1200 major worldwide companies providing goods and services in the communication arena. The purpose of "Blue Tooth" technology is to develop products and standards for local or short distance, two-way, wireless communication. For example, the communication may be wireless communications between different items of office equipment within a few hundred feet of each other. The office equipment could, as example only, be between a computer and a monitor and/or keyboard. Another example could be a wireless telephone system in an office complex. Other communication could be wireless emergency or routine update signals from an operating piece of manufacturing equipment. Extensive information regarding the "Blue Tooth" technology and protocol may be found on the internet at "bluetooth.com".

More general information concerning "Blue Tooth" includes a September 1999 article by Joyce Putscher of the Cahners In-Stat Group located at 1101 S. Winchester Blvd., Bldg. N, San Jose, Calif. 95128. The article is entitled "*The Bluetooth Revolution:" Wireless Semiconductors Kill the Cord*", and has the following two e-mail addresses: 1)www.instat.com and 2) info@instat.com. The article is hereby incorporated by reference in its entirety.

Referring again to FIG. 5, it will also be appreciated that a direct wire connection 88 between the computer and the hands-free device could be used rather than using wireless communication such as Blue Tooth or others. However, whether the communication system uses "Blue Tooth" or some other technology, to be completely hands-free, and as shown in FIG. 5, the computer device 82 may also include voice recognition 90 and voice synthesis 92 capability such as is presently available so that commands can be given through the microphone 26 to the computer. Information, including information in response to requests for information, may then be provided by voice synthesis from the computer to the speaker 28 of the hands-free device. According to this version of the hands-free communication device of the invention, rather than the printed circuit board simply providing electrical conductor paths as was discussed with respect to FIG. 2, there may be one or more connection or mounting pads for a complex microprocessor and/or memory included on the printed circuit board. In addition, the more complex embodiments of the hands-free headset of this invention may also require a power source for the electronic circuitry. Thus, FIG. 5 also includes a small coin-type rechargeable battery 94.

Figure 6:
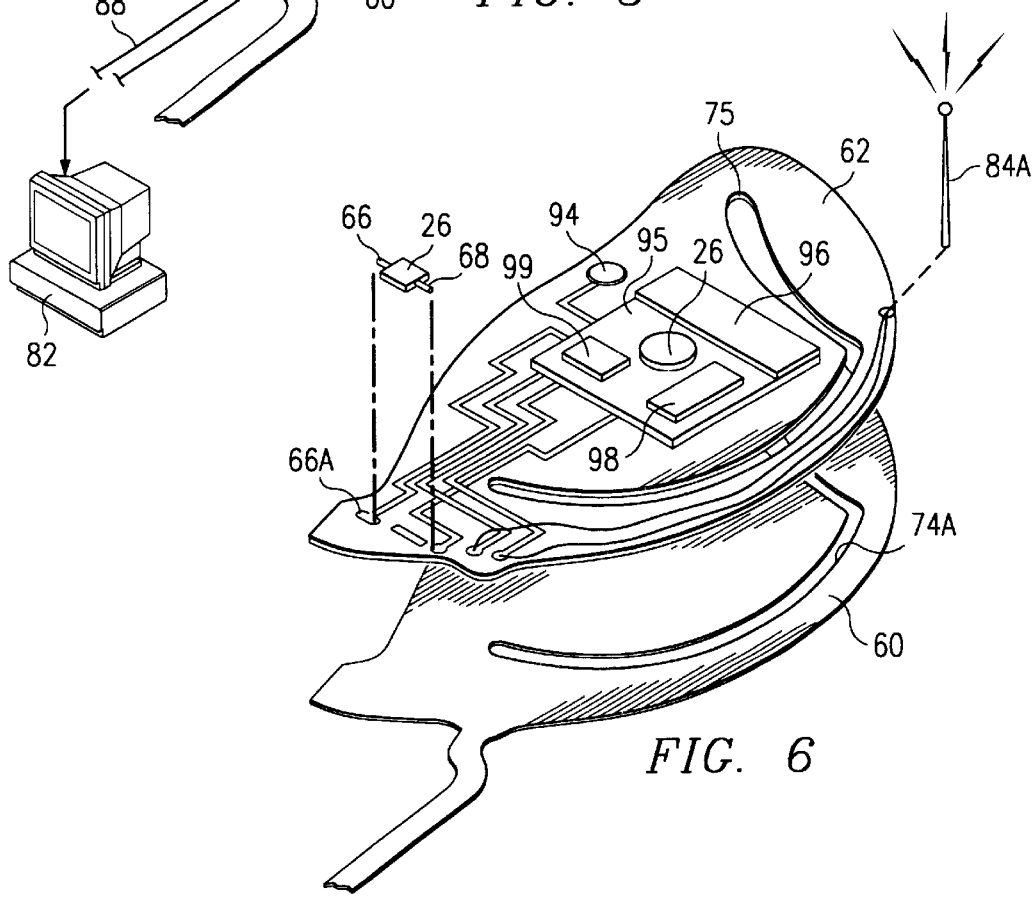
FIG. 6 shows a cellular telephone embodiment of the hands-free communication device of the present invention.

FIG. 6 shows a cellular telephone embodiment of the hands-free device of the present invention. The cellular telephone device preferred embodiment includes the use of a microchip 95 having sufficient memory 96 and voice recognition circuitry 98 located on the printed circuit board 62 such that dialing instructions and perhaps other commands could be provided to the hands-free cellular telephone portion 99 of microchip 95. It will be appreciated of course that with such a self-contained device using voice recognition, a number pad such as commonly used on presently available cellular telephones would not be required.

According to another embodiment of the present invention, and as was discussed with respect to FIG. 2, a speaker tube 40 runs from a position in front of the mouth to a microphone located on the printed circuit board 62. However, it has been found that the tube 40 can be substantially decreased in length such that only a small stub is required for picking up the sound for the microphone. Further, if newly available turned electrostatic speakers are used, the microphone boom may be completely eliminated.

Figure 7:
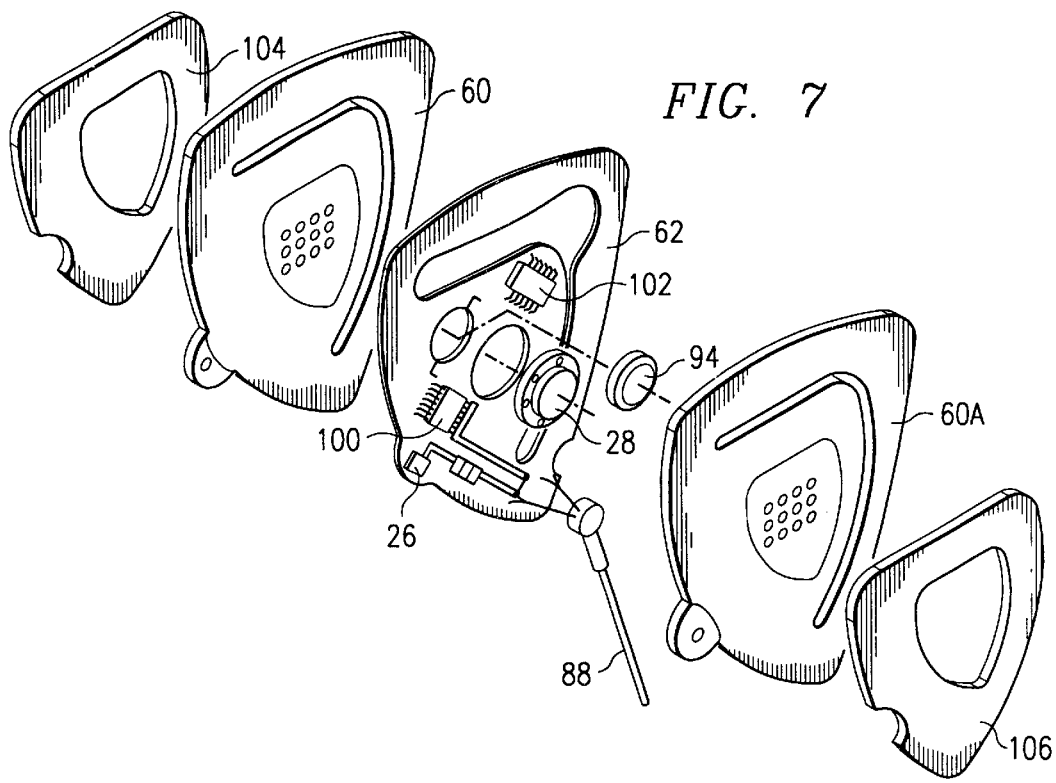
FIG. 7 shows an exploded view of a rugged embodiment of a hands-free headset incorporating features of the present invention.

FIG. 7 illustrates an exploded view of a rugged hands-free headset of the present invention which includes one or more electronic circuitry chips such as chips 100 and 102 mounted to printed circuit 62. This embodiment also includes a second flexible planar member 60a such that the electronic components 100 and 102 and both surfaces of the printed circuit 62 are covered and protected. This embodiment may operate with a microphone boom or alternately may include an electrostatic tuned microphone 26 which operates satisfactorily without a microphone boom. This rugged embodiment also includes a pair of cover plates 104 and 106 which may be made from metal or a high-impact plastic.

As was discussed above, FIG. 2 shows a large speaker member 28 which must be soldered or otherwise connected to the connector pads 70a and 72a on printed circuit board 62. However, as discussed above, flat speaker members are now available as are other sound producing devices having much less mass and size than the speaker shown in FIG. 2. For example, greeting cards which play an audible message have very flat and inexpensive speaker devices. Thus, incorporating such small, inexpensive speakers into the device of the present invention will reduce the weight even further and thereby increase the comfort level. In addition, it is anticipated that future sound making devices and future sound receivers such as microphones may be produced by using semiconductor fabrication techniques such that the speaker and microphone are etched or fabricated as an integral part of the printed circuit board.

Figure 8:
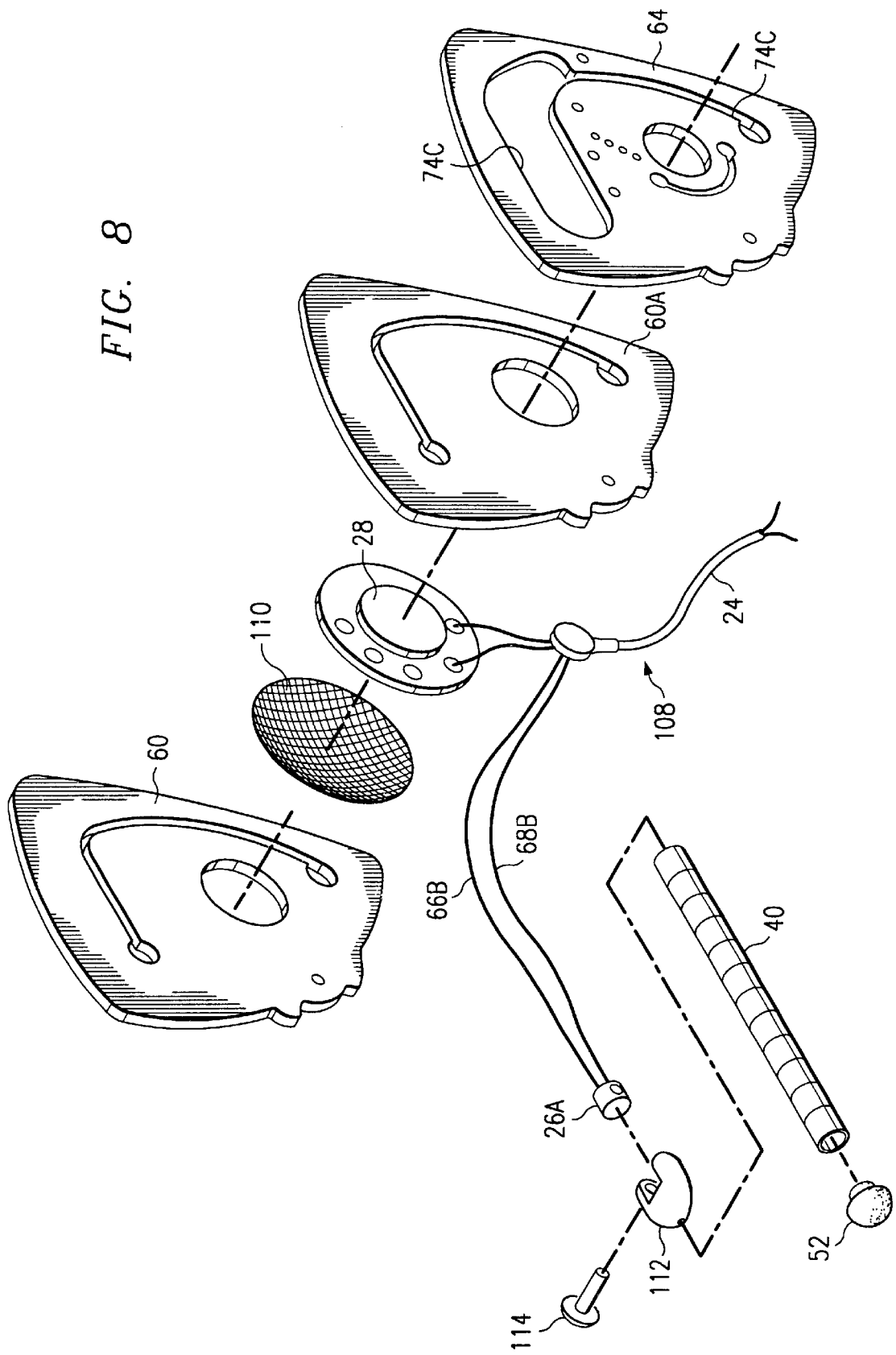
FIGS. 8 and 9 show exploded views of simple and inexpensive embodiments of hands-free headsets incorporating features of the present invention.
Figure 9:
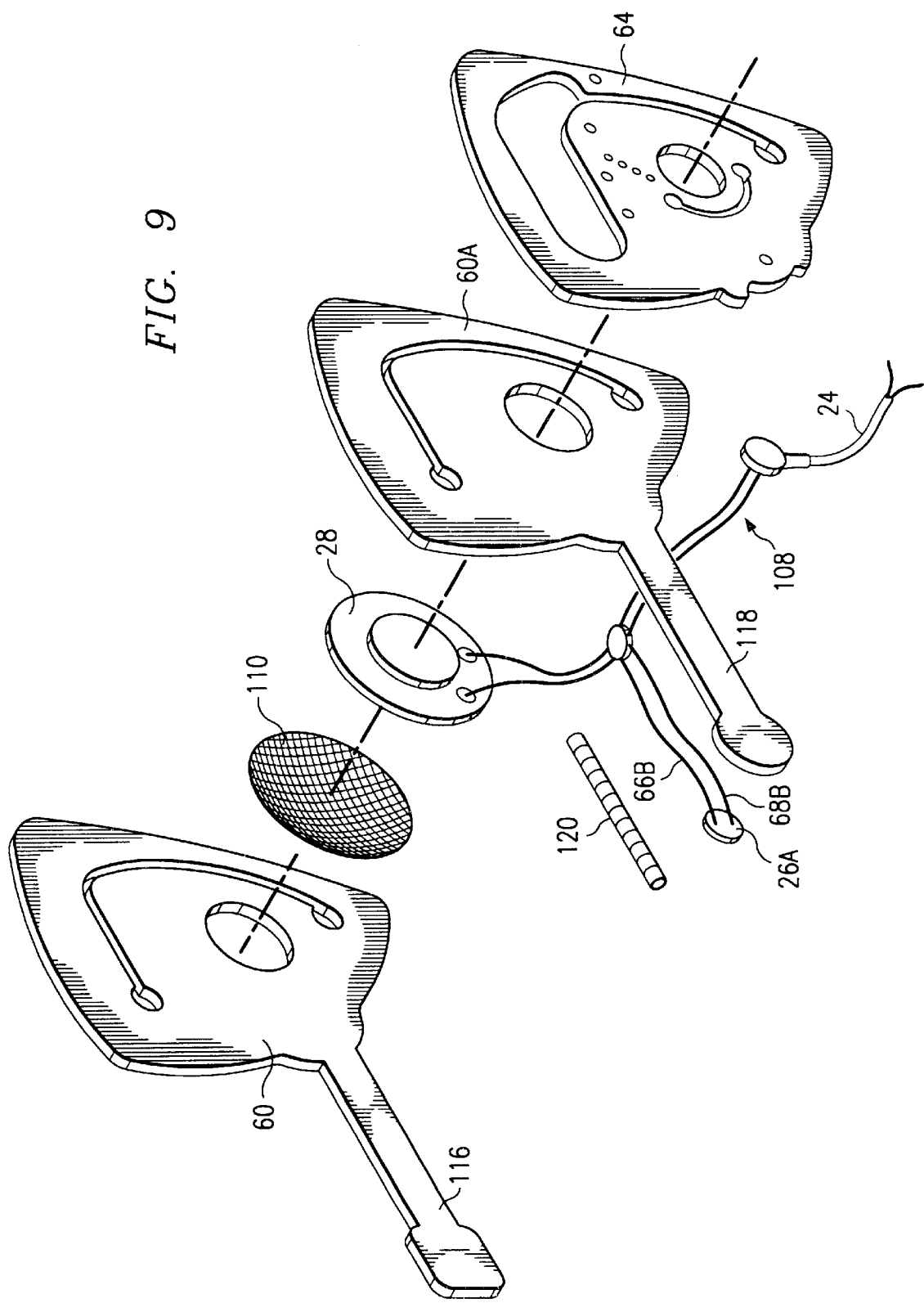

Two further embodiments which still provide a lightweight, comfortable-to-wear headset, but which are also extremely inexpensive to manufacture are shown in FIGS. 8 and 9. Components of these two embodiments which are the same as those discussed with respect to FIG. 2 or prior art FIGS. 1A and 1B carry the same reference numbers. However, this embodiment incorporates a wiring harness 108 similar to the prior art device discussed with respect to FIGS. 1A and 1B rather than a printed circuit board such as shown in FIG. 2. Wiring harness, shown generally at 108 is connected to the microphone 26a and speaker 28 in the same manner as the prior art devices of FIGS. 1A and 1B. In addition, there is included a second flexible planar backing member 60a, which may be substantially identical to flexible planar backing member 60. Also, as is clear from the FIGS. 8 and 9, the wiring harness is sandwiched between planar backing members 60 and 60a. Also, according to this embodiment, the cover or protective cover 64 may be die cut and formed or pressed out of a very thin sheet of spring steel. It should also be noted that the top portion of the slot 74c is much wider so that the thin steel sheet 64 will not come in contact with the wearer's ear. Other components of this embodiment include a perforated or rubber microphone tip 52 to cover and protect the microphone. There is also a small stainless steel grid 110 which is located between planar support member 60 and speaker 28. A boom clip 112 and pin 114 are shown in the embodiment of FIG. 8 as a technique for mounting speaker tube 40 to the device. FIG. 8 includes a microphone tube 40 similar to that of FIG. 2. However, according to FIG. 9, there is no microphone tube 40 and instead each of the planar flexible members 60 and 60a include an extension 116 and 118 which sandwiches the microphone 26a and the signal conductors 66b and 68b. Because the flexibility of the material used for planar members 60 and 60a, an elongated malleable metal wire 120 or other material is also sandwiched with the signal conductors 66b and 68b so that the microphone may be positioned in front or adjacent the user's mouth.

Figure 10:
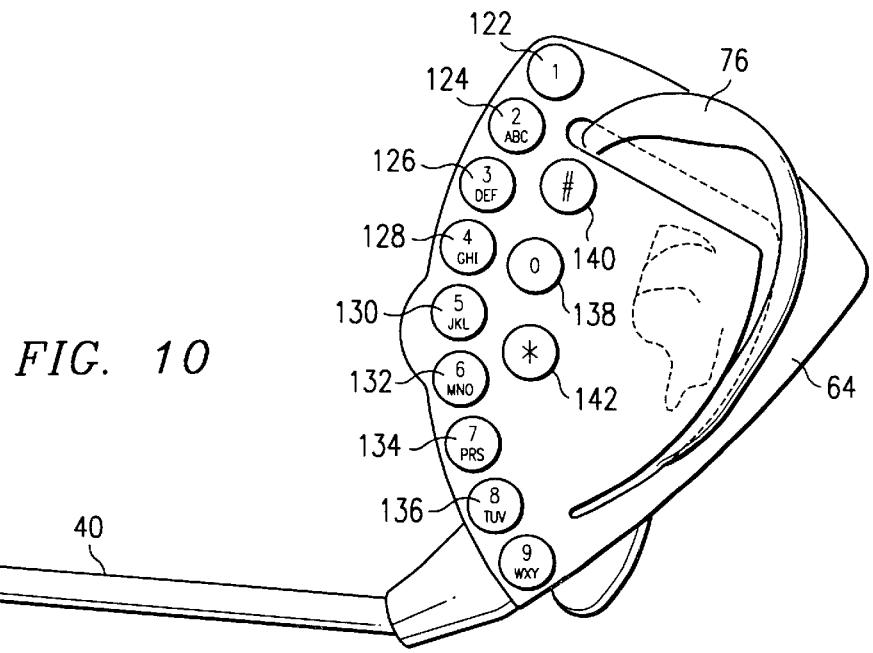
FIG. 10 shows an embodiment of the device of FIG. 2 and further includes a keyboard attached to the protective cover.

Referring now to FIG. 10, there is shown an enhanced embodiment of the device shown in FIGS. 2–6. As shown, cover 64 includes a plurality of indicia pads, such as a touch telephone type twelve key pads 122 through 142. Alphanumeric pads 122 through 142 are typically touch sensitive or capacitive activated pads having an electrical connection through cover 64 to printed circuit 62. Thus, if the hands-free device included cellular telephone signal processing circuitry, the pad would be used for dialing a telephone connection in the normal manner. It is also possible, of course, that other alphanumeric pads requiring multiple strokes per letter, or having sufficient keys to cover the entire alphabet could be provided. Alternately, a group of solar or photo electric cells (not shown) may be located on the cover in the same location and instead of the alphanumeric keypads. The photoelectric cells will be combined with circuitry and a storage device such as a capacitor (not shown) for providing power to operate the signal processing circuitry.

FIGS. 11A and 11B show an embodiment of the present invention which includes a case 146 which works in conjunction with the hands-free device 148 having a flexible microphone extension tube 150. If should be noted the perimeter outline shape of device 148 is different from the shape of the device discussed with respect to FIGS. 2–7. It will be appreciated, of course, that the perimeter outline of the device may be of substantially any shape which cooperates with the human ear in the manner discussed above. Device 148 may be easily inserted in case 146 through open end 152 by simply bending the microphone extension tube as shown at 150a.

As shown, case 146 includes an alphanumeric keypad such as, for example, the touch telephone keypad 153 shown in FIG. 8B. Signals may be transmitted between device 148 and case 146 according to any suitable technology including radio waves (such as Blue Tooth), an electrical cable (not shown), or even infrared such as by light emitting diode 154 on case 146. A light detecting diode 156 on device 148 receives the transmission. Of course, any of the methods of connection between case 146 and device 148 (except for the electrical cable) will required the necessary signal processing circuitry (not shown) to receive and process the RF signals or the infrared signals.

As shown in FIG. 11C, an array 158 of solar or photoelectric cells may be included on the case 146 rather than the alphanumeric pad 152. Alternately, both the alphanumeric pad 153 and the array 158 of photoelectric cells may be included on different sides of the case 146. In the embodiment shown with respect to FIGS. 11A and 11C, an electrical storage means such as a capacitor (not shown) in device 148 can be charged by power generated by the array of photo cells 158 when the device 148 is placed in the case 146. As shown, case 146 includes electrical contacts 150a, and 162a which mate with electrical contacts 160b and 162b on device 148 when the device 148 is in case 146.

Alternately, an opening or transparent window 164 may be included in case 146 to allow a device similar to the device of FIG. 10, but having photoelectric cells 122–142 rather than alphanumeric touch pads to receive light even when the device is in case 146.

Figures 12, 13:
FIGS. 12 and 13 show embodiments of the invention with different selected perimeter outlines relative to the profile of a user.

FIGS. 12 and 13 illustrate hands-free communication devices of this invention having still other possible outline perimeter shapes. As shown, the devices shown in these figures are in position on the left ear of a user. In the same manner as long distance telephone calling cards which may readily be purchased at a drugstore or the like often carry a logo for advertisement purposes, a logo is shown on the device of FIG. 12.

It is anticipated that the material cost and the manufacturing process of this invention can be so greatly reduced, that the telephone may be considered disposable after so many hours or minutes of use. Alternately, just as telephone calling cards can be reactivated for a specific amount of money by incorporating a microchip such as used by "smart cards", the hands-free device of this invention may incorporate a chip or circuitry similar to a smart card so as to provide a selected number of hours or minutes of operation which can be recharged or activated for additional time by paying a selected amount of money.

Although the present invention has been discussed to this point as a communication device for speaking and hearing, miniaturization of components allows it also to be used for certain types of visual communication. Referring again to FIG. 3B, the illustrated hands-free device also includes a visual support boom 166 extending from the front edge 168 to a point visible by one eye of the user. The boom 166 may support a visual indicator 170 at its free end and carry electrical conductors from printed circuit 62 to visual indicator 170. Visual indicator 130 may be selected to be a simple indicator advising of the occurrence of an event such as a single LED (light emitting diode) or even a small incandescent light. Alternately, visual indicator 170 may be a more complex visual device such as a multi-element array of organic light emitting diodes (OLED) or an LCD (liquid crystal display). As an example, a basic LCD visual indicator could comprise a line of a plurality of five×seven (5×7) LCD elements which would allow the display of alphanumeric messages. For a more elaborate display, the visual device could comprise a more extensive array of OLED or LCD elements (about 100,000 elements) for displaying pictorial images.

Just as a microphone for use with the basic headset discussed in FIG. 2 could be mounted on the printed circuit with a hollow sound tube extending to a location proximate the user's mouth, the visual indicator 170 may also be mounted directly on printed circuit 62. The visual image of the visual indicator 170 is then transmitted to a display lens or screen at a viewable position proximate the user's eye by a bundle of optical fibers carried by the visual support beam 166 from visual indicator 170 to the viewable position. Mounting the visual display or indicator 170 directly on the printed circuit 62 and transmitting a light image to the user's eye by a bundle of optical fibers may allow for the use of extremely complex visual displays including, for example, a long array of OLED's or the digital micro-mirror display (DMD) chip technology manufactured by Texas Instruments, Inc. of Dallas, Texas. One example of the DMD chip is about ⅝"×½"×1/16" and contains over 500,000 individual pixels which can produce television quality images.

Figure 14:
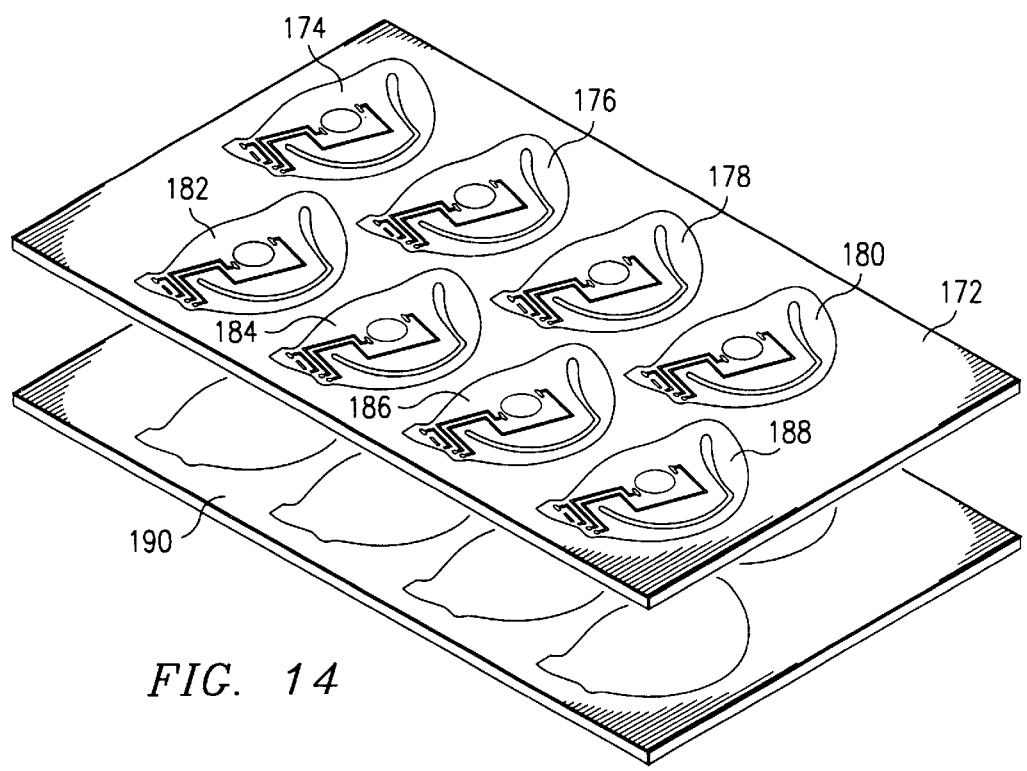
FIG. 14 illustrates a portion of the process for manufacturing a plurality of the devices.

Referring now to FIG. 14, there is shown a sheet of a flexible material 172 defining a plurality of shapes 174–188 having a selected perimeter outline according to the teachings of this invention. Each of the plurality of shapes support a flexible printed circuit which at least includes electrical conductive paths and an input connection as shown at reference number 174. Therefore, as will be clear to one skilled in the art, the individual shapes with the printed circuit can be cut out or otherwise separated from the sheet of material 172 and each other. A speaker such as speaker 28 described with respect to FIGS. 2, 3, 5 and 6 may be connected to each of the printed circuits either before or after separation, to manufacture a plurality of the simple headset devices shown in FIG. 2. More complex headsets such as discussed above can also be easily manufactured by using complex printed circuits by mounting or integrally forming the more elaborate types of signal processing already discussed to the printed circuit. It will also be appreciated by those skilled in the art that one or more sheets of printed circuits may be placed on top of each other such that the individual circuit of one sheet such as sheet 172 in register with the individual circuits of another sheet such as sheet 190. The sheets are then bonded to each other and the overlaid circuits are electrically connected. After the plurality of shapes are separated from each other, each individual unit will include a complex multilayered printed circuit and associated components such as the speaker and microphone Thus, it is seen that the radical departure of this invention from the design and components used in prior art hands-free communication devices lends itself to the production of inexpensive, ultra light, comfortable and in some cases, disposable products.

The corresponding structures, materials, acts, and equivalents of all means or step plus function elements in the claims below are intended to include any structure, material, or act for performing the function in combination with other claimed elements as specifically claimed.

What is claimed is:

1. A hands-free communication device comprising:

a planar flexible support member;

an input connection for receiving signals having a sound content;

a flexible printed circuit bonded to said planar flexible support member and connected to said input connection for processing said signals having a sound content and for generating output electrical signals representative of said sound content; and a sound generation device connected to said flexible printed circuit for receiving said output electrical signals and for generating audible sound representative of said sound content.

2. The device of claim 1, wherein said planar flexible support member has a selected size and a selected perimeter outline and defines a selected cut or separation line extending between two end points for dividing said planar flexible support member into two portions and at least one of said end points being wholly within said perimeter outline.

3. The device of claim 2, wherein both of said two end points are wholly within said perimeter outline.

4. The device of claim 2, wherein said two portions of said flexible support member may be flexibly spread along said separation line from each other such that said device transitions from a common plane form to a three dimensional form and so that one of said two portions may be located so as to cover at least a portion of an ear and the other one of said two portions fits behind said ear.

5. The device of claim 4 wherein spreading said two portions away from a common plane by a predetermined amount results in said flexible support member being biased into maintaining a position defining said three dimensional form.

6. The device of claim 5 wherein said two portions may be spread in either direction from each other along a line substantially perpendicular to said common plane such that said device can be used with either the right ear or the left ear.

7. The device of claim 4 wherein conforming edges of said separation line interfere with each other to click or maintain said biased position of said two portions in said spread condition.

8. The device of claim 2, wherein said flexible printed circuit is bonded to said flexible support member so as not to overlay said selected cut or separation line.

9. The device of claim 1, wherein said flexible printed circuit includes circuitry for processing signals having a sound content provided from at least one device selected from the group consisting of computers, telephones, radio receivers and microphones.

10. The device of claim 1, and further including a sound receiving unit connected to said flexible printed circuit for receiving audible sounds and generating input electrical signals representative of said received audible sound, and wherein said printed circuit includes circuitry for receiving said input generated electrical signals for processing.

11. The device of claim 10, wherein said sound receiving unit is a microphone.

12. The device of claim 4 wherein said printed circuit includes an elongated extension portion of a selected length having an attached end and a free end, said attached end fixed to said printed circuit to position said free end at a selected distance from said sound generation device on said flexible circuit and proximate the mouth of a user, said extension portion including a pair of conductors, and further including a microphone electrically connected to said pair of conductors at said free end of said extension.

13. The device of claim 12 and further including signal processing circuitry electrically connected to said flexible printed circuit and calibrated to said microphone at said selected distance from said sound generation device to provide noise cancellation.

14. The device of claim 1, and further including an antenna connected to said input connection for providing said signals having a sound content.

15. The device of claim 1, and further including electronic circuitry spaced from said device for generating electrical signals having said sound content, an electrical cable connected between said electronic circuitry and said input connection for transmitting said generated electrical signal having said sound content from said electronic circuitry to said input connection.

16. The device of claim 10, wherein said received signals having a sound content provided to said flexible printed circuit are provided by a computer.

17. The device of claim 16, wherein said computer is a hand-held or miniature computer.

18. The device of claim 16 wherein said computer includes hardware and programming for transmitting RF signals according to "Blue Tooth" protocol and said device further including receiving and processing circuitry electrically connected to said printed circuit for receiving and processing said RF signals transmitted according to said "Blue Tooth" protocol.

19. The device of claim 18 wherein said computer further includes hardware and programming for receiving RF signals according to "Blue Tooth" protocol and said processing circuitry of said device further includes circuitry for transmitting signals according to "Blue Tooth" protocol.

20. The device of claim 10, wherein said flexible printed circuit receives said signals having a sound content for processing from a cellular telephone network.

21. The device of claim 16, wherein said computer includes voice recognition circuitry.

22. The device of claim 16, wherein said flexible printed circuit includes circuitry for processing said signals received from said computer and generates said output electrical signals having a sound content.

23. The device of claim 1 wherein said sound generation device is an electrostatic type speaker.

24. The device of claim 1 wherein said sound generation device is a piezoelectric type speaker.

25. The device of claim 4, suitable for being located on one ear, and a second substantially identical device suitable for being located on the other ear for providing stereo sound.

26. The device of claim 3, wherein said two portions of said flexible support member may be separated from each other in a manner such as to clip said device to the lapel of a wearer.

27. The device of claim 4, and further comprising a cover layer for covering at least a portion of said device.

28. The device of claim 27 and further including an electrical conductor such that components secured to said cover layer may be electrically connected to said printed circuit.

29. The device of claim 28 wherein said cover layer includes a group of photoelectric cells for receiving light and providing power for use by said device.

30. The device of claim 28 wherein said layer includes an indicia pad attached to said cover layer such that signals can be transmitted from said pad to said printed circuit when pressure is applied to selected ones of indicia on said pad.

31. The device of claim 30 wherein said pad of indicia includes a selection of alphanumeric symbols.

32. The device of claim 1, wherein said flexible printed circuit board provides conductive electrical paths, and said processing of signals having a sound content comprise routing electrical signals from said input connection to said sound generation device along said conductive electrical paths.

33. The device of claim 16 wherein said computer further generates signals having a visual content and said signals having a visual content are provided from said computer to said device and said device includes circuitry connected to said printed circuit for receiving and processing said signals having a visual content to provide electrical output visual signals, said device further comprising a visual indicator attached to said device visible by at least one eye of a wearer, said visual indicator receiving said electrical output visual signals and providing a visual representation of said content of said signals having a visual content and generated by said computer.

34. The device of claim 33 wherein said visual indicator is a light indicator.

35. The device of claim 33 wherein said visual indicator is an LCD (liquid crystal display) device.

36. The device of claim 35 wherein said signal processor connected to said printed circuit provides signals representing a line of alphanumeric characters.

37. The device of claim 35 wherein said signal process connected to said printed circuit provides signals representing a pictorial image.

38. The device of claim 22 wherein said visual indicator is a digital micro-mirror device DMD.

39. The device of claim 33 and further including a visual support beam extending from said flexible printed circuit to a position proximate a user's eye.

40. The device of claim 39 wherein said visual support beam supports said visual indicator proximate said user's eye and carries electrical conductors between said printed circuit and said visual indicator.

41. The device of claim 39 wherein said visual indicator is mounted on said printed circuit and said visual support beam carries a bundle of optical fibers extending between said visual indicator and a position proximate said user's eye.

42. The device of claim 1 and further including a case to receive and protect said device when said device is not in use.

43. The device of claim 42 wherein said case includes a group of photoelectric cells on a surface of said case for receiving light and providing power for use by said device.

44. The device of claim 42 wherein said case includes a pad of selected indicia attached to a surface of said case and a connection between said case and said device such that signals can be transmitted therebetween when pressure is applied to said selected indicia.

45. The device of claim 42 wherein said pad of selected indicia is an alphanumeric pad.

46. The device of claim 42 wherein said connection is an infrared connection.

47. The device of claim 42 wherein said connection is a pair of conductors.

48. The device of claim 42 wherein said case comprises selected electronic circuitry and further including a connection between said case and said device such that electrical signals can be transmitted between said device and said case.

49. A hands-free communication device comprising:

a flexible printed circuit for use as a flexible support member and for receiving and processing signals having a sound content and for generating output electrical signals representative of said sound content;

an input connection for receiving said signals having a sound content; and a sound generation device connected to said flexible printed circuit for receiving said output electrical signals and for generating audible sound representative of said sound content.

50. The device of claim 49, wherein said flexible printed circuit has a selected size and a selected perimeter outline and defines a selected cut or separation line extending between two end points for dividing said flexible printed circuit into two portions, at least one of said end points being wholly within said perimeter outline such that said two portions remain attached to each other.

51. The device of claim 50, wherein both of said two end points are wholly within said perimeter outline.

52. The device of claim 50, wherein said two portion of said flexible printed circuit may be further separated from each other such that one of said two portions may be located so as to cover at least a portion of an ear and the other one of said two portions fits behind said ear.

53. A hands-free communication device comprising:

a first flexible support member having a selected perimeter outline;

a second flexible support member having a selected perimeter outline substantially the same as said selected perimeter of said first flexible support member; and a wiring harness connected to a speaker and a microphone and having an input wire connection, said wiring harness sandwiched and secured between said first and second flexible planar support members.

54. The device of claim 53, wherein said first and second planar flexible support members have a selected size and a selected perimeter outline and define a selected cut or separation line extending between two end points for dividing said first and second planar flexible support members into two portions and at least one of said end points being wholly within said perimeter outline.

55. The device of claim 53, wherein both of said two end points are wholly within said perimeter outline.

56. The device of claim 53, wherein said two portions of said flexible support members may be flexibly spread along said separation line from each other such that said device transitions from a common plane form to a three dimensional form and so that one of said two portions may be located so as to cover at least a portion of an ear and the other one of said two portions fits behind said ear.

* * * * *